United States Patent [19]

Montgomery

[11] Patent Number: 5,159,226

[45] Date of Patent: Oct. 27, 1992

[54] TORSIONAL FORCE TRANSDUCER AND METHOD OF OPERATION

[75] Inventor: Melvin Montgomery, Plano, Tex.

[73] Assignee: Atlantic Richfield Company, Los Angeles, Calif.

[21] Appl. No.: 554,030

[22] Filed: Jul. 16, 1990

[51] Int. Cl.$^5$ .......................................... H01L 41/08
[52] U.S. Cl. .................................. 310/333; 310/334; 310/358; 367/82; 340/853
[58] Field of Search ............................. 310/322-325, 310/328, 334-337, 333, 348, 359, 366; 367/82, 165; 175/40; 340/853

[56] References Cited

U.S. PATENT DOCUMENTS

| | | | |
|---|---|---|---|
| 3,506,858 | 4/1970 | Shaw | 310/333 |
| 3,583,677 | 6/1971 | Phillips | 310/333 X |
| 3,588,804 | 6/1971 | Fort | 340/18 |
| 3,697,940 | 10/1972 | Berka | 340/18 |
| 3,719,907 | 3/1973 | Adler | 310/333 |
| 3,790,930 | 2/1974 | Lamel et al. | 367/82 |
| 4,001,773 | 1/1977 | Lamel et al. | 367/82 |
| 4,139,836 | 2/1979 | Chaney et al. | 340/18 |
| 4,156,229 | 5/1979 | Shawhan | 340/18 P |
| 4,166,979 | 9/1979 | Waggener | 325/321 |
| 4,206,810 | 6/1980 | Blackman | 166/336 |
| 4,283,779 | 8/1981 | Lamel | 367/82 |
| 4,283,780 | 8/1981 | Nardi | 310/334 X |
| 4,293,936 | 10/1981 | Cox et al. | 367/82 |
| 4,302,826 | 11/1981 | Kent et al. | 367/82 |
| 4,314,365 | 2/1982 | Petersen et al. | 367/82 |
| 4,499,566 | 2/1985 | Abbott | 367/165 |
| 4,546,459 | 10/1985 | Congdon | 367/155 |
| 4,562,559 | 12/1985 | Sharp et al. | 367/82 |
| 4,597,067 | 6/1986 | Bockhorst et al. | 367/82 |
| 4,649,525 | 3/1987 | Angona et al. | 310/333 X |
| 4,715,451 | 12/1987 | Bseisu et al. | 175/40 |
| 4,802,143 | 1/1989 | Smith | 367/82 |
| 4,905,107 | 2/1990 | Klein | 310/333 X |

FOREIGN PATENT DOCUMENTS 8910573 11/1989 PCT Int'l Appl.
278274 5/1971 U.S.S.R. ........................... 310/333

OTHER PUBLICATIONS

Squire, et al., "A New Approach to Drill-String Acoustic Telemetry", Presented at 54th Annual Fall Technical Conference and Exhibition of the Society of Petroleum Engineers of AIME, Las Vegas (Sep. 1979).

Balogh, et al., "New Piezoelectric Transducer for Hole-to-Hole Seismic Applications", Presented at 58th Ann. Internat. Mtg. Soc. Expl. Geophys., Expanded Abstracts, 155-157.

Honeybourne, "Measurements While Drilling", Presented at Symposium to Mark the 75th Anniversary of the Foundation of the Oil Technology Course at the Royal School of Mines (Jul. 1988).

Philips Export B.V., "PXE High-power Actuator for Electronic/Mechanical Interfacing", *Technical Publication 165* (Jun. 1985), Printed in The Netherlands.

*Primary Examiner*—Mark O. Budd
*Attorney, Agent, or Firm*—Vinson & Elkins

[57] ABSTRACT

A transducer and method for imparting vibrational signals to a structure are disclosed. In one embodiment, a set of piezoelectric disks are constructed in conjunction with a deformable housing to impart controlled distortions to the structure, such as to a well pipe string. Torsional forces are applied to the structure due to the orientation of the piezoelectric material relative to the electric field applied thereto. The piezoelectric material is placed in layers, with the polarization axis orthogonal to the direction of the electric field. Alternate layers are oriented in opposing directions, and alternating electrodes are connected together, so that each layer cooperates with the others to twist the housing in the same direction. To improve transmission, the apparatus can be tuned to a frequency determined by a spectrum analysis of the pipe string. A reactance mass may be connected to the transducer to increase the amplitude of the imparted vibrations, and also to allow tuning of the frequency of vibrations of the transducer.

13 Claims, 9 Drawing Sheets

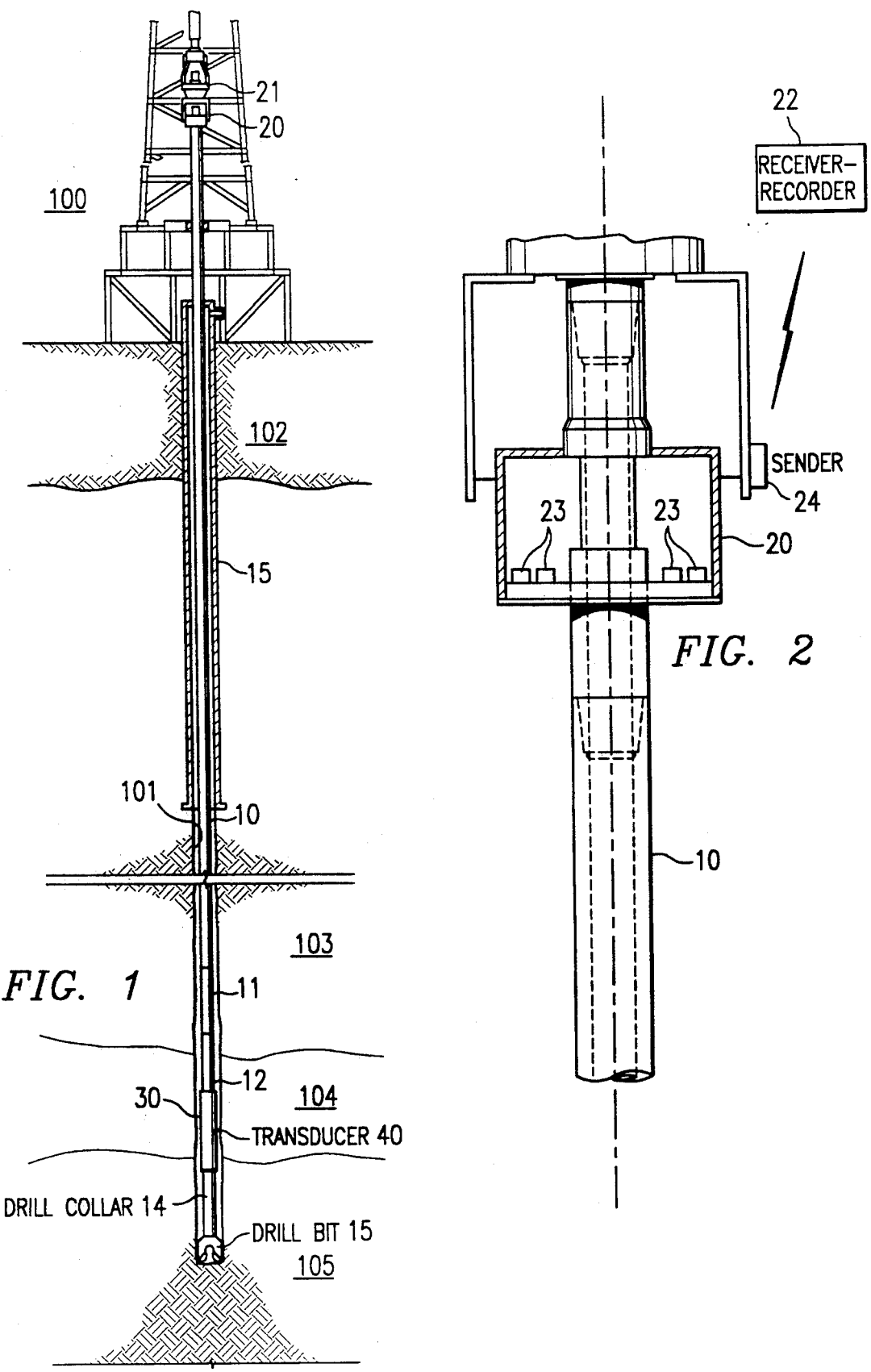

TORSIONAL FORCE TRANSDUCER AND METHOD OF OPERATION

This invention relates to an apparatus and method of applying signals to a solid structure and more particularly to such an arrangement using a piezoelectric transducer to induce torsional forces.

This application is related to application Ser. No. 554,022, filed herewith, entitled "Piezoelectric Transducer for High Speed Data Transmission and Method of Operation".

BACKGROUND OF THE INVENTION

During the drilling of deep holes, such as for oil and gas wells, it is often desired to transmit signals from deep within the drilled hole to surface detectors. The type of information which is desired from the bottom of the borehole includes data about the drilling conditions, such as the weight or pressure on the bit, the location of the bit, and its instantaneous angle. In addition, other significant information, such as the seismic energy input by the drill bit to the earth for purposes of seismic processing, could be utilized if the data could be efficiently transmitted to the surface in real-time, during the drilling operation.

Prior methods have been used for the transmission of data from the bottom of the borehole to the surface. One of these techniques transmits data by modulation of the pressure of the drilling fluid, or "mud", in the drill string (see Honeybourne, "Measurement While Drilling", Symposium on the 75th Anniversary of the Oil Technology Course at the Royal School of Mines (1988)). As described in this presentation, data may be transmitted by way of positive or negative changes in the pressure of the drilling fluid, accomplished by restriction or venting of the fluid to modulate the pressure. Another technique for such data transmission via the drilling fluid generates a carrier wave in the fluid which is modulated by way of a motor, or mud siren. While these systems have been shown to be operable to transmit data, they each are quite limited in their rate of signal transfer (i.e., bits per second, or baud rate) from downhole to the surface.

As well bores lengthen, the problem becomes even more severe: Under the best of conditions, the data transfer rate for the mud transmission method, for example, is on the order of 3–10 data bits per second. In practice, the usual physical conditions encountered in the drilling process, together with other problems such as wear, reduce the effective data transfer rate for this system to a rate on the order of one bit every two seconds. This limited data rate prevents the transmission of anything but rudimentary and slowly changing information in a real-time manner, for example temperature and gamma ray emission data.

In addition, this technique requires that the drilling mud continue to flow in a controlled manner during data transmission. Due to blockages and other drill string problems, the free flow of the drilling fluid cannot be guaranteed. Accordingly, use of modulations of the pressure of the drilling mud to transmit data during drilling may be limited.

Other conventional techniques include hardwire communication, either by use of conductive drill pipe or by a cable guide system, and also electromagnetic transmission using the earth as the transmission medium. Hardwire transmission requires relatively complex hardware, as either a cable system must be included in the drill string, and lengthened during drilling or the composition of the drill pipe must be selected and used, each of which can be costly. The electromagnetic transmission system depends on such factors as the conductivity of the earth, and accordingly has not gained widespread acceptance.

The transmission of data by way of vibrations in the drill pipe string has been developed to overcome some of the problems with transmission through drilling mud, hardwire, or through the earth. A first example of such a system uses a solenoid-striker which is energized electrically according to the data to be transmitted by mechanical vibrations from downhole to the surface. An example of such a system is described in U.S. Pat. No. 4,597,067, issued Jun. 24, 1986. However, it should be noted that such prior systems similarly operate at relatively low data rates (on the order of 1 to 10 Hz).

As described in U.S. Pat. No. 4,597,067, an alternative method for dealing with such low data rates is to store the detected information in a downhole memory, for transmission to the surface at a later time. While such a system provides for eventual transmission of a significant amount of data, the downhole storage negates the ability of the system to transmit data real-time. Accordingly, this type of system has limited applications, particularly when real-time information is desired, such as, for example, transmittal of drill inclination and direction data for adjustment of the drill bit during the drilling operation. In such a case, the information is valuable only if quickly transmitted to the surface. In addition, such a system also requires relatively complex electronics for its implementation.

Besides low data rate, another problem with prior systems for communicating data by mechanical drill string vibrations is the weakness of the mechanical signal, especially considered relative to the vibrations in the drill string which are inherent during the drilling operation. Accordingly, various prior techniques have used such transmission of data during such times as the drilling is stopped. Examples of such systems are described in U.S. Pat. No. 4,597,067 discussed above, and in U.S. Pat. No. 4,314,365 issued Feb. 2, 1982. While sending data during non-drilling periods provides for improved signal-to-noise ratio, such systems will of course not be useful in providing real-time information during drilling.

The problem of weak vibrational signal was also addressed in U.S. Pat. No. 4,562,559, issued Dec. 31, 1985. This method uses a series of repeaters along the length of the drill string, such repeaters providing a boosted vibrational signal (at a different frequency to avoid interference), in order to send a sufficiently strong signal to the surface. Such a system, besides adding complexity, also requires the addition of more repeaters as the depth of the borehole increases.

Another type of prior system monitors, at the surface, the inherent vibrations of the drill string generated from the drilling operation. From these vibrations, which of course depend upon the operation and condition of the drill bit, calculations are made as to what is occurring below ground. This method requires assumptions about the type of drill bit behavior which causes the sensed vibrations, and accordingly the deductions can be at best an approximation of the drill bit status.

Yet another prior technique utilizes a magnetostrictive device to modulate the inherent vibrations of the drilling operation, with torsional vibrations corresponding to the information to be communicated to the surface. This technique is described in U.S. Pat. No. 3,790,930 issued Feb. 5, 1974, in U.S. Pat. No. 4,001,773 issued Jan. 4, 1977, and by Squire and Whitehouse, "A New Approach to Drill-String Acoustic Telemetry", paper SPE 8340, presented to the 54th Annual Fall Technical Conference and Exhibition of the Society of Petroleum Engineers (1979). The ability of the magnetostrictive device to generate mechanical signals of significant power is questionable, however.

Another system for transmitting data along a drill string is referred to as stress wave telemetry. A stress wave telemetry system is disclosed in copending U.S. Patent application Ser. No. 188,231 filed Apr. 29, 1988, now U.S. Pat. No. 4,992,997, issued Feb. 12, 1991, also assigned to Atlantic Richfield Company, and incorporated herein by this reference. This system uses equipment outside the periphery of the drill string, such as solenoids and eccentric motors, to vibrate the drill string in a manner corresponding to the desired data.

Various problems must be overcome in constructing and using a bit-to-surface data transmission having real time capability, regardless of the technique. The drilling environment is generally hostile in temperature and pressure, and also varies from location to location. In addition, the drill pipe and bit are continually moving within and against a confined space, providing vibrational noise and wear. Furthermore, due to the confined space and the distance from the surface, the ability to apply electrical power near the end of a drill string is limited.

A prior physical actuator is described in Technical Publication 165 by Philips Export B.V. (1985). This actuator is a piezoelectric actuator formed of a pile of piezoelectric discs, for example formed of lead titanate or lead zirconate, which are held in compression by a cylindrical steel spring, and which are interleaved with copper foil electrodes. Physical actuation is accomplished by application of a voltage across the electrodes which cause the discs to expand, stretching the spring and extending the actuator.

Tests of this actuator demonstrated, however, that the size of the actuator (length on the order of 50 to 100 mm) caused the amplitude of the vibrations to be too small for application to a drill string or other similarly large physical structure. In addition, it was found that the actuator, particularly the HPA2 model, would not be capable of reliably providing oscillatory motion, as the heat generated in the material during such operation would be excessive. This material is instead best adapted to operation in a similar manner as a solenoid actuator (i.e., in a DC switching manner).

It is therefore an object of my invention to provide a mechanism for transmitting data in the form of torsional vibrations along a structure such as a drill string at a high data rate.

It is a further object of my invention to provide such a mechanism which operates at a frequency and amplitude which allows its use real-time to vibrate a large scale structure, such as a drill string during a drilling operation.

It is a further object of my invention to provide such a mechanism which provides a signal having sufficient power so that significant additional hardware along the drill string is not required.

It is a further object of my invention to provide such a mechanism which fits within the circumference of the drill string, so that the drilling operation and the mechanism itself are not adversely affected by its presence.

It is a further object of my invention to provide such a mechanism which can generate such vibrations at tunable frequencies.

It is a further object of my invention to provide such a mechanism which can transmit vibrational information over a drill string as it is lengthened during drilling, without requiring modification.

It is a further object of my invention to provide such a mechanism which can be used for data transmission in the application of a drilling operation, either from bottom to top or from top to bottom.

It is a further object of my invention to provide such a mechanism which can be used at a plurality of frequencies, with the frequency response of the structure indicative of its physical condition.

Other objects and advantages of the invention will be apparent to those of ordinary skill in the art having reference to this specification together with the drawings.

SUMMARY OF THE INVENTION

The invention may be incorporated into a device which is placed within a structure, such as a drill string, for vibrating the structure with torsional waves so that the vibrations transmit information. The device includes material, such as piezoelectric material, which physically responds to electrical signals. The material is placed in multiple layers within a housing, with electrodes between the layers. The polarization axis of each of the layers of material is orthogonal to the electric field placed thereacross by the electrodes, so that the piezoelectric material will generate a rotational force, relative to the longitudinal axis of the housing, responsive to the electric field. In the preferred embodiment, alternating layers of material are disposed in alternating orientations, with alternating electrodes connected together. This construction allows all of the layers in the transducer to move cooperatively in the same direction, with the torsional force generated by the addition of the forces from each layer. The transducer preferably has a free moving end with an attached mass for increasing the kinetic energy applied to the structure. The frequency at which the information is transmitted can be selected according to the frequency response of the structure. In addition, the frequency response of the structure can be monitored using the device of the invention to indicate factors, such as temperature, joint tightness and the structural integrity of the pipe. Multiple transducers, mounted at different positions, can be used, each transmitting at different frequencies to reduce interference therebetween.

BRIEF DESCRIPTION OF THE DRAWINGS

For a more complete understanding of the present invention and for further advantages thereof, reference is now made to the following Detailed Description, taken in conjunction with the accompanying Drawings, in which FIG. 1 is a vertical section view in schematic form of a drill string boring into the earth;

FIG. 2 is a detailed elevation of the upper end of the drill string;

DETAILED DESCRIPTION OF THE INVENTION

Figure 4:
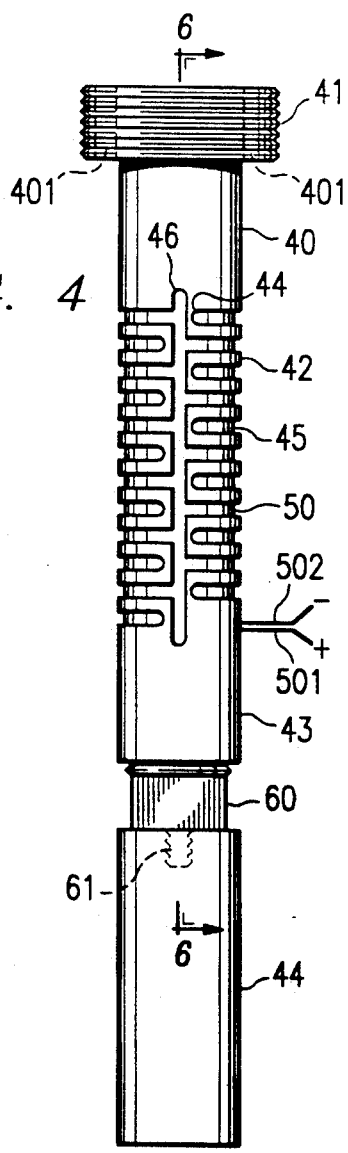
FIG. 4 is a view of the transducer device disconnected from the sub.

The present invention contemplates the provision of a transducer for inducing vibrations (stress waves) into a drill string for use in telemetry systems particularly adapted for use in conjunction with deep earth drilling operations. It has been determined that stress waves may be transmitted along elongated steel pipe or tubing strings as either axial compressional waves, which, in steel, have a velocity in the range of about 16,000 feet per second, or as torsional waves which have a velocity in the range of about 10,000 feet per second. By propagating these waves at selected frequencies along the drill stem or tubing string, suitable signal transmission may be carried out from relatively deep locations in well bores to or near the surface and sensed by accelerometers and strain gauges of a suitable type mounted on the drill stem or tubing string at the surface, such as those described in U.S. Pat. No. 4,715,451, issued Dec. 29, 1987, assigned to Atlantic Richfield Company, and incorporated herein by this reference. It should be noted that the transmitted data is preferably in digital form, which may be accomplished by digitally modulating a carrier signal transmitted along the drill stem, for example by frequency or phase shift keying, to indicate the binary states. As noted hereinabove, a prior stress wave telemetry system is described in copending application Ser. No. 183,231 filed Apr. 21, 1988, also assigned to Atlantic Richfield Company, and incorporated herein by this reference.

Referring now to FIG. 1, an example of the context into which the mechanism of the present invention may be incorporated will be described. FIG. 1 illustrates well bore 101 which has been, and is being, drilled through and into earth formations, or strata, 102, 103, 104 and 105. In accordance with the general drilling procedure, an elongated drill string or tubing string 10 is lowered into well bore 101. Drill string 10 includes subs 11, 12 and 30 near its distal end, which are connected to drill collar 14 and, in turn, drill bit 15.

Drill string 10 extends from a conventional drilling rig 100 and is suspended from a suitable swivel 21 in a conventional manner. Swivel 21 may be adapted to rotate the drill string in a so-called top drive arrangement or the drill string may be rotated during normal operation by a conventional rotary table drive not shown. In addition, drilling fluid, or "mud", is generally pumped into and out of the well bore. As is well known, this drilling fluid prevents the expansion of gases within the various formations, and also serves to lubricate the drilling operation of drill bit 15 and to lift the cuttings to the surface of the earth. As will be discussed in further detail below, subs 11, 12, and 30 preferably are designed so that the drilling fluid can be pumped therethrough.

According to this embodiment of the invention, sub 30 includes transducer device 40 which is mounted therewithin. Transducer 40, under the control of electrical signals provided to it, exerts physical force against sub 12 in string 10. This physical force imparts vibrations into drill string 10 which correspond to the electrical signals, and the vibrations are then communicated through drill string 10 to sensors located at the earth's surface.

The vibrations generated by the transducer 40 in sub 30 are, according to this embodiment of the invention, used in a telemetry manner to send signals up the drill string. The behavior of drill string 10 in transmitting the vibrations from transducer 40 up to the receiver near the surface can be considered as sufficiently elastic as to be able to be vibrated by transducer 40 at relatively high frequencies, as will be described in further detail hereinbelow. The transmitted vibration signals may be picked up by, for example, surface sensors or by other sensors located within any of the other subs adjacent thereto.

It should be noted that space is quite limited within the well bore, for example between the walls of the hole and drill string 10. In addition, during the drilling operation, devices such as described in the above-referenced application Ser. No. 183,231 which are disposed outside of the drill string 10 are subject to the rotary and flex motions of the drill string. According to the instant invention, transducer 40 is mounted within drill string 10 so that the vibrations are applied from the inside out. As will be described in further detail below, the problem of limited cross-sectional area within the drill pipe is solved by mounting the vibrating device longitudinally along the axis of the drill string 10.

As noted above, drilling fluid can flow through sub 30 which contains transducer 40. The distal end of sub 30 is preferably constructed to be similar to the end of any section of drill string 10, so that transducer 40 can be located anywhere along the length of drill string 10. If desired, multiple transducers 40 may be located at different elevations and can function as repeaters, so that attenuation effects of long drill strings 10 can be reduced. However, it is contemplated that for the length and construction of drill string 10 in most applications, a single transducer 40 will have sufficient power and frequency response to generate easily detectable vibrational signals at a data rate as high as 300 baud, and perhaps higher, depending upon the signal transmission and processing techniques used. This represents a one hundred fold baud rate improvement over existing telemetry methods and systems.

Due to this high data rate, the transducer 40 according to this invention significantly improves the performance of many conventional data transmission applications. For example, as described in said U.S. Pat. No. 4,715,451, and in said application Ser. No. 183,231, information about the drillstem loading, and other attributes concerning the drilling operation such as drill bit position, angle, pressure, etc., may be communicated by way of transducer 40 according to the invention to the surface.

In addition, since it has been demonstrated that the data rate achievable by transducer 40 according to this invention is quite high, on the order of 300 bits per second, other applications which heretofore have not been achievable via stress wave telemetry are now enabled. For example, the vibrations and other energy imparted into the earth by drill bit 13 may be considered as seismic source waves, with their reflections from sub-surface strata analyzed to define sub-surface hydrocarbon reservoirs. It is contemplated that the instant invention can provide telemetry of sufficient data rate that the source signature of the drill bit 13 may be accurately communicated to the surface for meaningful analysis. In addition, the frequency response of the drill string 10 to the transducer 40 may also be utilized in characterizing and periodically testing the physical integrity of the structure into which transducer 40 is used.

Accordingly, in connection with the present invention, drill string 10, for example within sub 30 itself, may include sensing elements for sensing various information which is to be transmitted by vibrations in drill string 10 generated by transducer 40. Such sensing elements may include conventional accelerometers, strain gages, or piezoelectric transducers for translating mechanical energy into electrical signals. Further included within sub 30 may be an electrical energy source, conversion electronic circuits, data acquisition and manipulation circuits, and a CPU, if desired, as will be discussed relative to the schematic of FIG. 7, which will operate to translate the electrical signals received from the sensing elements into such form as to operate transducer 40 in the desired fashion.

Alternatively, while not shown, transducer 40 could be mounted along the drill string 10 at or near the earth's surface and used, for example, to send signals down to sensors near the bit end of drill string 10, for example located within sub 30. Such telemetry could be used for controlling drill bit 13, as well as other downhole apparatus such as disaster valves. In addition, intermediate sensors and transducers could be located intermediately along drill string 10, for boosting the signals in repeater fashion along drill string 10 from bit to surface, or from surface to bit, as the application warranted.

For purposes of explanation, FIG. 1 illustrates the example where transducer 40 is provided near the bottom of the borehole 101, with detection of the vibrations to be accomplished near the surface of the earth. FIG. 2 illustrates sensors 23 within housing 20 located at the top of drill string 10. Sensors 23 sense the vibrations induced into drill string 10 by transducer 40 discussed above, and present an electrical signal corresponding to the sensed vibrations. Sensors 23 can be conventional accelerometers, strain gages, or piezoelectric sensors, as are well known in the art. The electrical signals output by sensors 23 are preferably transmitted by a conventional transmitter, or sender, 24 to receiver-recorder 22.

While FIG. 2 shows one set of sensors 23, a CPU unit may receive the output of sensors 23, for local conversion of the received data, or alternatively for local (i.e., at the drill string 10) analysis. As mentioned above, several such sensors 23 may be placed along drill string 10, in cooperation with other transducers 40, such that a string of repeating elements is formed along drill string 10. Such a string can pass information from one section of drill pipe 10 to another in the path from bottom to top (or, alternatively, from top to bottom).

Figure 3:
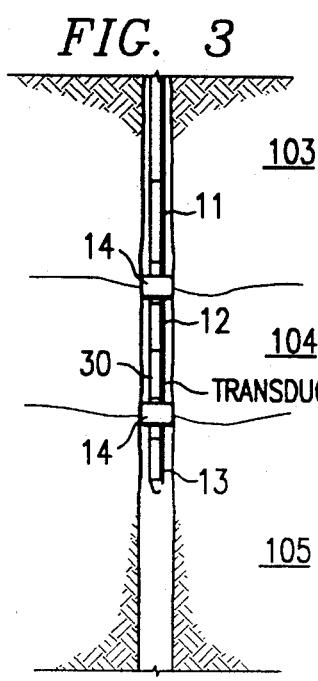
FIG. 3 is a vertical view of a test drill string.

FIG. 3 shows another application of transducer 40 according to the instant invention. FIG. 3 illustrates a drill string testing arrangement where packers 14 have been added to drill string 11 in a conventional manner, so that certain lengths along the drill hole are blocked off. This blocking is useful, as is well known in the art, to allow thorough structural testing of portions of the drill string without interaction of the drilling mud from the portion of drill string 11 outside that of interest. For example, the portion of drill string 12 which is disposed between packers 14 is isolated from drilling mud flowing out of the drill bit and back up in the bore hole outside of drill string 12. According to the instant invention, signals from the well bottom can be transmitted to the surface via transducer 40 without attenuation from the drilling mud along the portion of the drill string 11 between packers 14. Accordingly, higher frequency operation of transducer 40, or smaller signal amplitudes, can be used and detected.

Figure 7:
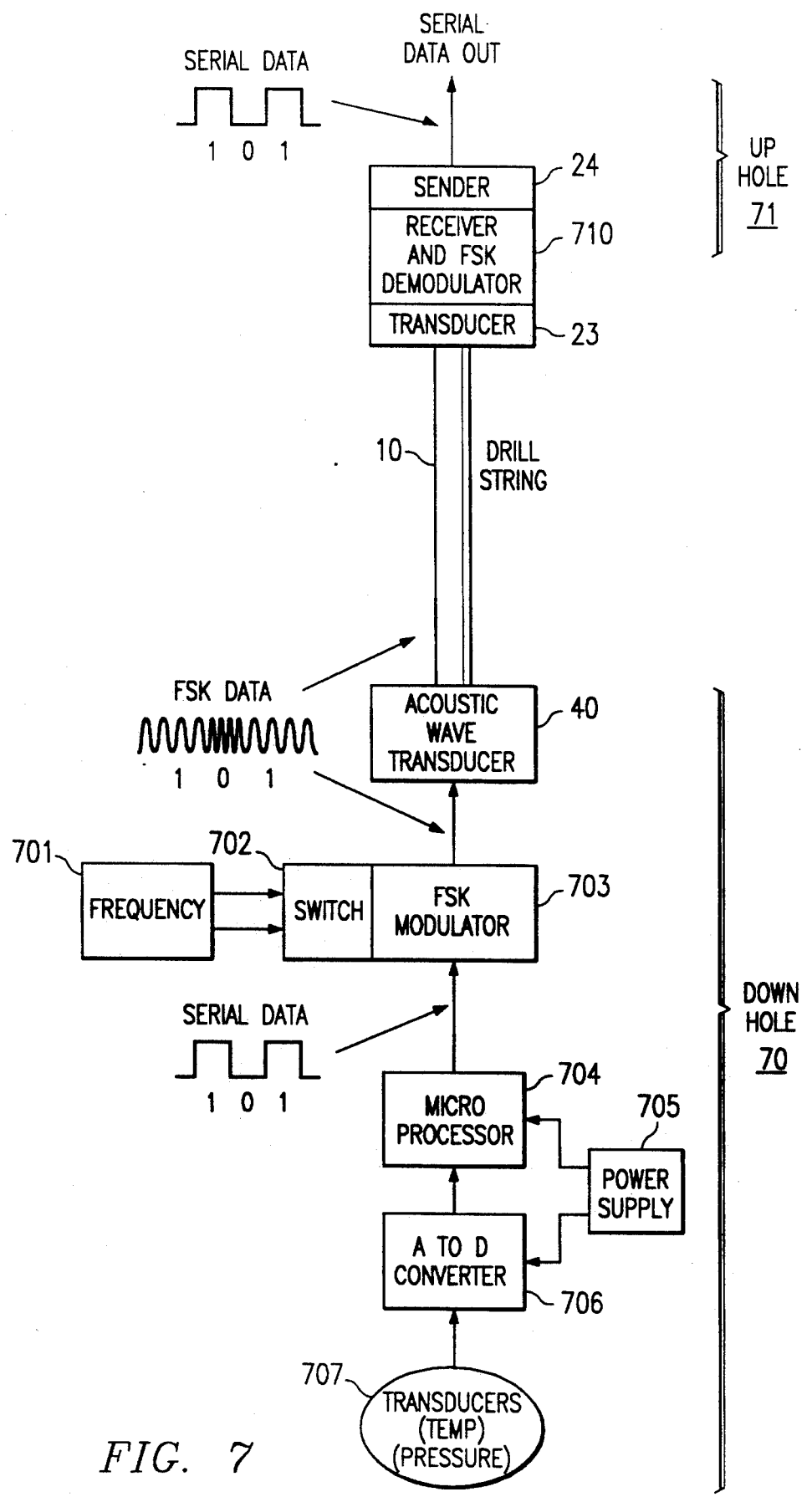
FIG. 7 shows a system for using the expansion device in a telemetry system for inducing signals into a drill string.

Referring to FIG. 7, the construction, in block diagram form, and operation of an implementation of a system according to a preferred embodiment of the invention is illustrated. The system of FIG. 7 includes transducers 707, which can be temperature or pressure sensitive, or may be any other type of transducer or signal generating device as discussed above, measuring, for example the conditions or operation of drill bit 13. Transducers 707 provide to analog-to-digital converter (ADC) 706 an analog electrical signal corresponding to the physical condition detected. ADC 706 can be any one of the well known analog-to-digital conversion circuits which operate to convert an analog signal to a digital representation thereof. The output of ADC 706 is connected to a microprocessor 704, such as a Z8 manufactured and sold by Zilog, or other general or special purpose microprocessor. Microprocessor 704 is used in this case to interpret the digital value of the detected physical signal, and to apply it as a serial digital data stream to a conventional frequency shift key modulator 703. As is well known in the art, frequency shift keying is a type of modulation which provides a signal at a first frequency to represent a digital "0", and at a second frequency to represent a digital "1". In the example of FIG. 7, frequency control circuit 701 provides sinusoidal signals at two frequencies, which are generally close together but distinguishable by a demodulator circuit. Switch 702 and FSK modulator 703 apply, to transducer 40, one of the two frequency signals output by frequency control circuit 701, based upon the serial digital data presented by microprocessor 704. Transducer 40, as discussed above, then generates an acoustic wave in pipe string 10 corresponding to the frequency shift keyed data received from FSK modulator 703. As will be discussed hereinbelow with reference to preferred embodiments of transducer 40, the acoustic wave is generated by the expansion and contraction, in a given direction, of a piezoelectric stack contained within transducer 40, to generate axial or torsional vibrations corresponding to the modulated signal applied thereto.

The axial or torsional vibrations induced onto drill string 10 (or into such other structure as can utilize the invention) are sensed by transducer 23. Transducer 23 can be a piezoelectric element, or alternatively an accelerometer, strain gage, or other conventional transducer for generating an electrical signal in response to a physical force applied thereto. The electrical output of transducer 23 is received by receiver and frequency shift key (FSK) demodulator 710, such as an XR-2211 demodulator/tone decoder manufactured and sold by Exar, or another conventional FSK demodulator/tone decoder circuit. The output of demodulator 710 is a digital signal, for example a serial data stream, which is communicated to sender 24. As a result there is a serial data output from sender 24 to a computer or other data processing or storage unit, for analysis of the received vibrational data in the conventional manner to determine the characteristics of the signals.

While frequency shift keying is discussed hereinabove, other data encoding techniques, including a simple repetitive frequency, or amplitude or frequency modulation, could alternatively be used. For example, phase shift keying or modifications thereof, could be employed to transmit data along the drill string. An example of an alternate prior method for frequency shift keying an electrical signal is described in U.S. Pat. No. 4,156,229 issued May 22, 1979, and an example of a prior method for phase shift keying an electrical signal is described in U.S. Pat. No. 4,562,559 issued Dec. 31, 1985.

Using transducer 40 and the techniques discussed herein, many systems can be constructed to transmit large amounts of information quickly from down hole 70 to up hole 71, or vice versa. By selection and modification of frequency control circuit 701, under local underground control, or by signals transmitted from a remote device, different transmission frequencies can be achieved and the frequency can be adjusted for optimum transmission along the drill string, as will be discussed hereinbelow. In addition, multiple transducers 40 can be placed along the drill string, each operating at a different frequency, or set of frequencies, to avoid interference with each other. Also as will be described hereinbelow, a sweep of transmission frequency may be used to determine the frequency response of drill string 10, which itself may include important data concerning the characteristics of the drill string 10 and its operation.

Compressional Wave Generator

Referring now to FIG. 4, the construction of a transducer 40 for imparting compressional waves along the axis of pipe string 10, or such other structure utilizing the invention, will now be described in detail. Transducer 40 includes a stack 50 of piezoelectric elements 53, 54, disposed within housing 43. Housing 43 is preferably connected at one end to a mass 44, which provides a reactance in the mechanical system of transducer 40 to provide an increased amplitude to the physical vibrations generated by transducer 40. At the other end, housing 43 includes a threaded mating end 41, for connecting transducer 40 to the drill string 10, or other structure to which the vibrations are to be imparted.

Housing 43 of transducer 40 is preferably constructed with a series of longitudinally displaced slits 45 defining ribs 42 which allow the unit to expand and contract along the longitudinal axis in the manner to be shown. Ribs 42 and slits 45 of housing 43 allow expansion (and contraction) along the longitudinal axis of transducer 40 from operation of the piezoelectric stack 50 contained therewithin. Ribs 42 and slits 45 can be constructed in any manner so that upon longitudinal expansion (or contraction) force being applied from the inside of the transducer device by stack 50, transducer device 40 can expand (or contract) along its longitudinal axis.

It should be noted, however, that the preferred design of slits 45, shown in FIG. 4, incorporates rounded terminations 44. It has been found that, especially for high amplitude and high frequency operation of transducer 40, rectangular terminations for slits 45, such as shown in the above-referenced Philips Technical Publication 165 (see, e.g., FIG. 3 thereof), result in the concentration of stress at the corners of the terminations of slits 45. This concentration results in increased metal fatigue and cracking at those locations. Of course, such cracking is not desirable, and could result in not only reduced amplitude output from transducer 40, but also in the inoperability of transducer 40 were such cracks to extend from one slit 45 to another such that housing 43 would be in two pieces.

Furthermore, the preferred design of slits 45 in housing 43 includes three vertical slits 46, such that ribs 42 are substantially in three sections. Three sections of ribs 42 provides improved stability to the equilibrium, extended, and contracted, positions of housing 43, as wobble due to the uneven length or extension of the sections of ribs 42 is minimized for a three-legged structure.

Tightening collar 60 is positioned at the bottom of transducer 40 and is used in the manner to be fully detailed hereinafter to apply pressure to piezoelectric stack 50 contained within device 40, in order to remove any space between the disks within the stack 50, such space resulting in less efficient conversion of the electrical signal to physical force.

Extending below collar 60 is a threaded stud 61 which is used, in the preferred embodiment, to hold a member 44 which acts to add additional mass to the free end of transducer 40. This mass increases the vibratory effect of transducer 40 so that the magnitude of the vibrations induced onto drill string 10 (FIG. 1) is increased. This increase in the amplitude of the vibrations results from the reaction of the mass of member 44 responsive to the expansion and contractions of the stack of elements 53, 54 to increase the vibration effect of the stack on drill string 10. As is well known, the kinetic energy of a moving object is directly proportional to its mass. Accordingly, the effect of increasing mass 44 is an increase in the kinetic energy imparted by transducer 40 to the drill string 10.

Furthermore, since the combination of mass 44, housing 43, and the action of piezoelectric elements 50 will cooperate in such a manner that the amplitude of the vibrations will be dependent upon the frequency of operation, the mass of member 44 can be adjusted so that the frequency characteristics of transducer 40 can be optimized according to the frequency response of the structure to which the vibrations are applied. Accordingly, the mass of member 44 may be increased or decreased depending upon various factors of the structure. For example, in the application of a drill string 10 where drilling mud is passed therethrough, the use of a heavier weight mud may require that the frequency of vibrations be reduced, as higher frequency vibrations would tend to be attenuated by the heavier mud to a greater extent. In such a case, the mass of member 44 would preferably be increased. Conversely, where lighter drilling mud is used, a higher frequency of vibration may be chosen in order to increase the data transmission rate; the mass of member 44 would preferably be reduced in this case.

Figure 5:
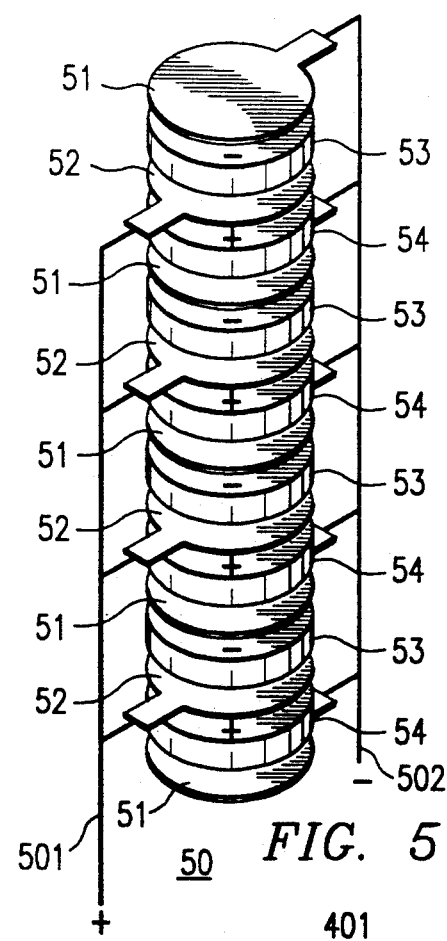
FIG. 5 shows a stack of piezoelectric elements for use inside the transducer device.

Turning now to FIG. 5, a series of piezoelectric elements 53, 54 which make up piezoelectric stack 50 in transducer 40 are illustrated. It has been found that the preferred material for piezoelectric elements 53 and 54 is lead zirconium titanate (or PZT), as this material has a good expansion versus applied voltage characteristic, while generating a relatively low level of heat by way of friction within the piezoelectric material. PZT has been used before as a piezoelectric material in high power applications, for example in sonar.

Each of PZT disks 53, 54 has a polarization axis, with positive and negative poles along this axis. As is well known in the art, piezoelectric elements are voltage polarity sensitive, and expand or contract along the polar axis upon the selective application of positive or negative voltage across and coaxial with the positive and negative poles. According to the normal convention, the application of a positive polarity voltage at the positive pole relative to the negative pole will cause the material to elongate along the polarization axis, while the application of a positive voltage at the negative pole relative to the positive pole will cause the material to contract along the polarization axis.

Examples of the dimensions of an element 53, 54, shaped as a disk, is on the order of 1.50 inches outside diameter, with an inside diameter on the order of 0.25 inches, and approximately 0.100 inches thick. A preferred embodiment of transducer 40 includes twenty-four elements 53, 54 in stack 50 in a housing 43 having a length on the order of ten to twelve inches. As will be indicated hereinbelow, a transducer 40 of these dimensions is capable of providing detectable vibrations, at a high data rate, along a drill string 10 of significant length.

In the embodiment of FIG. 5, this stack 50 of elements 53, 54 is constructed with a series of terminals 51 and 52, which can be copper or other conductive material, inserted between each element for the application of electrical energy thereto. Such a stack 50 may be constructed preferably by bonding elements 53, 54 and the copper electrodes with a high temperature silver epoxy.

In this embodiment, the orientation of piezoelectric elements 53 and 54 is alternately reversed along stack 50, with the elements labeled 53 having their negative poles facing upwards and with elements 54 having their positive poles facing upwards in FIG. 5. Accordingly, the negative sides of adjacent elements 53 and 54 are in contact with the same terminal 51 and the adjacent positive sides of each element are in contact with terminal 52. This construction allows all elements 53 and 54 to expand along the longitudinal axis of stack 50 with the application of a positive polarity voltage between terminals 52 and 51 (i.e., between leads 501 and 502), and for all elements 53 and 54 to contract along the longitudinal axis of stack 50 with the application of a negative polarity voltage between terminals 52 and 51 (leads 501 and 502). A typical voltage supplied to the piezoelectric stack in this embodiment is on the order of 3,000 volts peak to peak. This voltage can be generated from a transformer from a low voltage power source, such as a battery, since relatively little current is required to cause the piezoelectric stack 50 to respond in the manner above discussed.

In operation, piezoelectric stack 50 is located inside housing 43 of transducer device 40, as shown in FIG. 4, and power is selectively applied to leads 501 and 502 according to the signal to be transmitted (see the system of FIG. 7). In this preferred embodiment, transducer 40 either expands or contracts along its longitudinal axis responsive to the polarity of the voltage applied in this signal. As noted above, transducer 40 constructed according to the preferred embodiment, including PZT piezoelectric elements 53, 54 and the construction of housing 43 described hereinabove, can be operated in an oscillatory manner at relatively high frequencies, such as on the order of 2 kHz. Since transducer can operate in an oscillatory manner at such frequencies, the data transmission rate can be quite high, using conventional modulation techniques such as frequency or phase shift keying.

Figure 6:
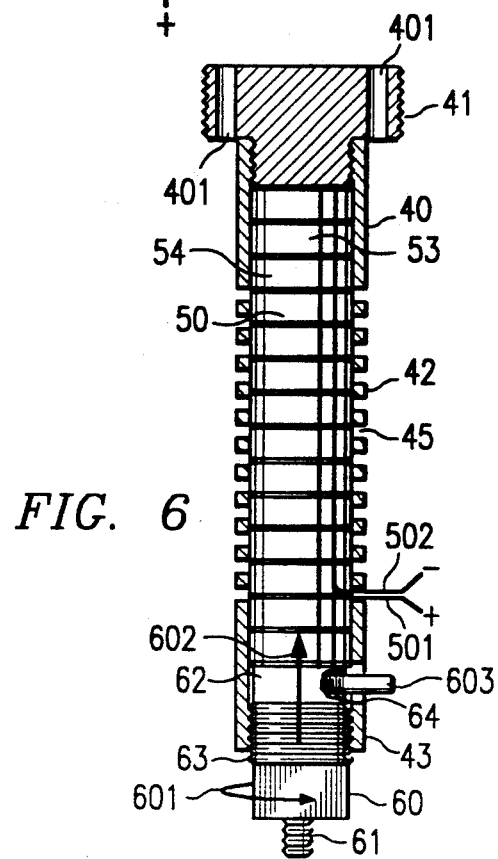
FIG. 6 shows a sectional view of an upper portion of the transducer device taken along Section 6—6 of FIG. 4.

FIG. 6 shows a sectional view of transducer 40, illustrating piezoelectric stack 50 as mounted inside housing 43. For improved operation of stack 50, additional pressure along the longitudinal axis of the stack is used, so that the stack is held tightly coupled, one element to the next. This pressure is controlled by the rotation of collar 60 such that as collar 60 is rotated in a clockwise direction, as shown by arrow 601, element 60 moves upwards along threads 63 inside device 40 and against spacer 62 to apply pressure on stack 50. This tightens stack 50, and reduces movement between elements 53, 54 therewithin. Spacer 62 is positioned within device 40 to prevent elements 53, 54 from twisting as collar 60 is rotated. Pin 603 is removably positioned within aperture 64 to prevent spacer 62 from itself rotating with collar 60.

It should be noted that a mismatch in the coefficients of thermal expansion may exist between the piezoelectric elements 53, 54, and the material of housing 43, which is preferably spring steel. It is therefore preferred that a temperature compensating extension, for example of brass, be incorporated into transducer 40. An example of the temperature compensating extension is spacer 62, which is tightened against piezoelectric elements 53, 54 in housing 43. Since the coefficient of thermal expansion of PZT is quite low relative to steel, with the thermal expansion coefficient of brass being somewhat greater than that of steel, the expansion of the brass extension (coupled with little expansion of the PZT) can compensate for the expansion of transducer housing 43 so that the effects of temperature on the efficiency of operation of transducer 40 are minimized.

Figure 11:
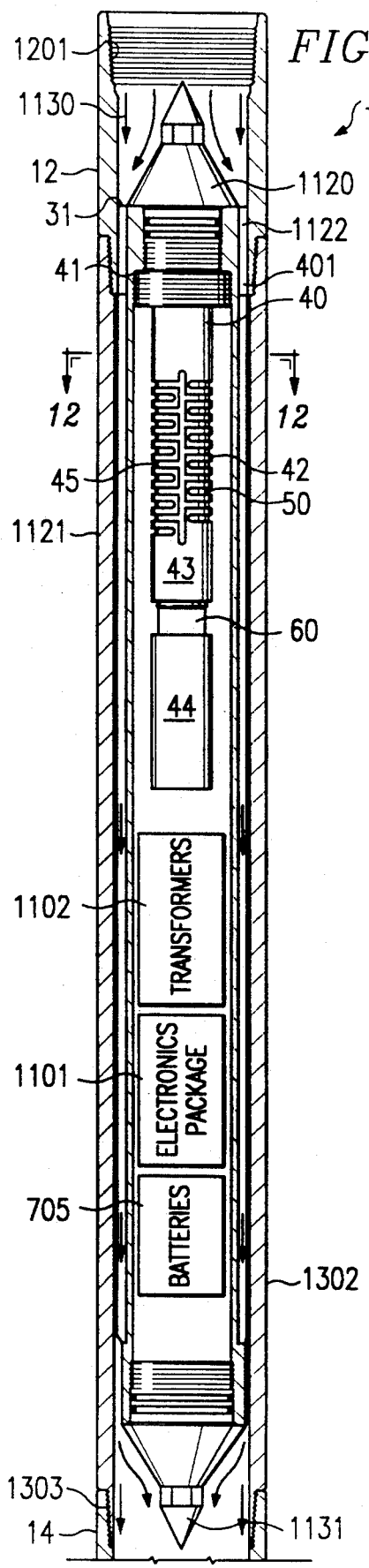
FIGS. 11, 12 and 13 show details of one preferred embodiment of the transducer sub.

Referring now to FIG. 11, a preferred embodiment of the installation of compressional wave transducer 40 into sub 30 of pipe string 10 will be described. FIG. 11 illustrates an internal cross-sectional view of sub 30 of drill string 10, connected by threads 1201 to sub 12 and connected by threads 1303, at its lower end, to drill collar 14. Threads 1201 and 1303 are preferably of the same size and density as those at the ends of sections of drill string 10, so that sub 30 is likewise adapted for continuous mating along drill string 10 at any desired location between sections.

Figure 12:
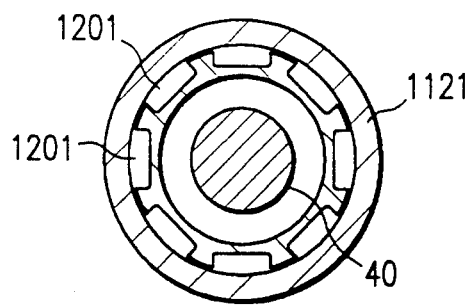

Within sub 30, plate 31 is fastened with sub 30 and has a central threaded receptacle therein for receiving the top threaded mating end 41 of housing 43. FIG. 12 is a cross-sectional area taken through Sections 12—12 of FIG. 11 and shows the cross-sectional view of channels 1201 which extend the entire length around transducer 40. Flow holes 1122 through plate 31 shown in FIG. 11 preferably match up with holes 1201 of FIG. 12, so that fluid may easily pass from sub 12 into sub 30 and flow through channels 1201. In the application where sub 30 is included within a drill string 10, as discussed above relative to FIG. 1, the top end with plug 1120, would be facing up hole and the bottom end with plug 1131, would be facing down hole. In this orientation, the drilling fluid will flow from top down, as indicated by arrows 1130, through port holes 1201 (FIG. 12), along slots 1122 toward the bottom end of sub 30, around bottom plug 1131, and out from sub 30 toward drill bit 15. The chamber containing transducer 40 and all of the electrical components previously noted relative to FIG. 7 (shown in FIG. 11 in block form, and in a preferred location within sub 30) may be enclosed and sealed with rubber o-rings at the upper and lower plugs. The path of drilling fluid will thus bypass transducer 40 and its controlling electronics.

As discussed above relative to FIG. 7, the controlling electronics in this embodiment include a transformer 1102 for stepping up the voltage from batteries 705 to a voltage sufficient to energize transducer 40. Batteries 705 may also serve as the power supply for the other electronic components (see FIG. 7). Such other components may include, within electronics package 1101 of FIG. 11, A-to-D converter 706, microprocessor 705, and the circuitry for providing the desired modulation (frequency control circuit 701, switch 702 and FSK modulator 703) to encode the information received from the transducers (not shown).

It should be noted that while piezoelectric elements 53, 54, and electrodes 51, 52 are shown in FIG. 5 as solid, they may alternatively be constructed as washers having an open center. If so constructed, fluid could additionally flow through the center of stack 50, assuming appropriate protection for the electronic components and wiring. Of course, because of the high voltage, moisture must be sealed away from the wiring.

With transducer 40 physically attached to sub 30, expansion and contraction along the longitudinal axis of transducer 40 is transmitted via plate 31 as compressional axial vibrations to sub 12. With subs 30 and 12 connected within drill string 10 as shown in FIG. 1, the compressional axial vibrations are thus transmitted along drill string 10 to the surface, for the example of transmission of data from downhole to the surface. As described above, mass 44 acts as a reactance mass to amplify the magnitude of the vibrations, so that vibrations of sufficient amplitude are transmitted at the desired frequency.

The application of electrical signals to transducer 40, as discussed above, correspond to the output of a transducer or other element as will be discussed hereinafter. As noted above, the resulting physical forces generated by transducer 40 in response to these electrical signals imparts vibratory forces to drill string 10 in a completely controllable manner, at an amplitude and frequency which provide detectable signals at a high data rate.

Figure 13:
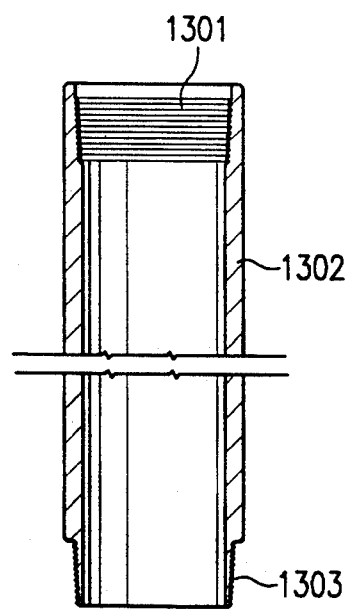

FIG. 13 illustrates an outer casing 1301 within which casing 1121 may alternatively be encased. This outer casing 1301 can provide a physical outer shield for sub 30, and can be used, as opposed to using inner casing 1121, to transmit the drilling torque from the surface to drill bit 15. Casing 1301 is connected flush with casing 1121 by means of female threads 1302 which mate with the male threads at the end of section 1121.

Figure 8:
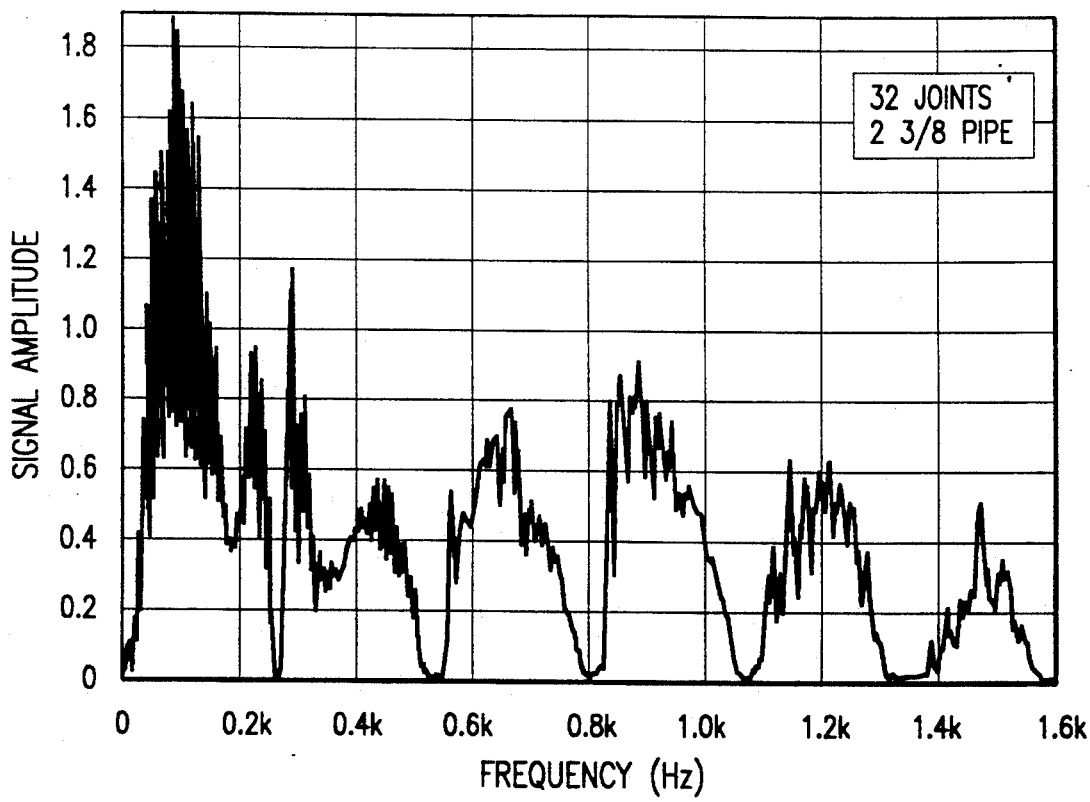
FIGS. 8, 9, and 10 show representative frequency charts illustrating the frequency response of the drill string to vibrations induced by the transducer.

The operation of a system constructed according to this embodiment of the invention, wherein transducer 40 is adapted to provide axial compression waves along drill string 10, will now be described. FIG. 8 shows the frequency response of a drill string 10 to compressional axial vibrations. The actual data taken for this frequency response characteristic is the response of the drill string 10 to the input of a hammer blow, which easily provides a wide band of frequencies in an aboveground testing mode. It is contemplated, however, that transducer 40 described hereinabove, with proper control of its output by the associated electronic components described above, can sweep a range of frequencies so that a frequency characteristic similar as that shown in FIG. 8 can be derived for a drill string or other structure already in place in the earth.

The frequency range for this plot is from 0 Hz to 1600 Hz, and the plotted response is for a drill string 10 having 32 joints, or each of 2⅜ inch diameter pipe and each approximately 31 feet in length. It should be noted that dead bands occur at approximately 260 Hz, 550 Hz, 800 Hz, 1050 Hz and 1400 Hz. The dead bands are areas where the signal will not pass along the pipe and is absorbed in that frequency. These dead bands result from reflections of the compressional axial vibrations within a single section of drill string 10. One can calculate an approximate base dead band frequency for a single section of pipe by dividing the velocity of compressional axial vibrations (approximately 16,000 ft/sec) by twice the length of the section. Accordingly, for a section approximately 31 feet long, the dead band frequencies for compressional vibrations is on the order of 260 Hz. For a drill string 10 having multiple sections, each of approximately the same length, the dead band frequencies, including the base dead band frequency and its integral harmonics, will align substantially with each other in the frequency response of drill string 10.

Between the dead band frequencies of the response, the pass bands have relatively high amplitude. Accordingly, a compressional axial vibration at a frequency between the dead band frequencies will pass along drill string 10 relatively well. The operation of a particular transducer 40 mounted within drill string 10 can thus be optimized by matching the frequency), characteristic (i.e., vibration amplitude versus frequency) of transducer 40 with the frequency response of the drill string 10 in which transducer 40 is to be installed. As described above, the mass 44 attached to housing 43 of transducer 40 can be defined so as to provide such a matching frequency characteristic. In the case of frequency shift keyed data as described above, the two frequencies assigned to the digital values should, of course, both lie in a pass band. It is preferred that both frequencies lie within the same pass band, as the use of two frequencies on either side of a dead band, e.g., one frequency above 260 Hz and one below 260 Hz, has been found to provide poor data transmission.

Figure 9:
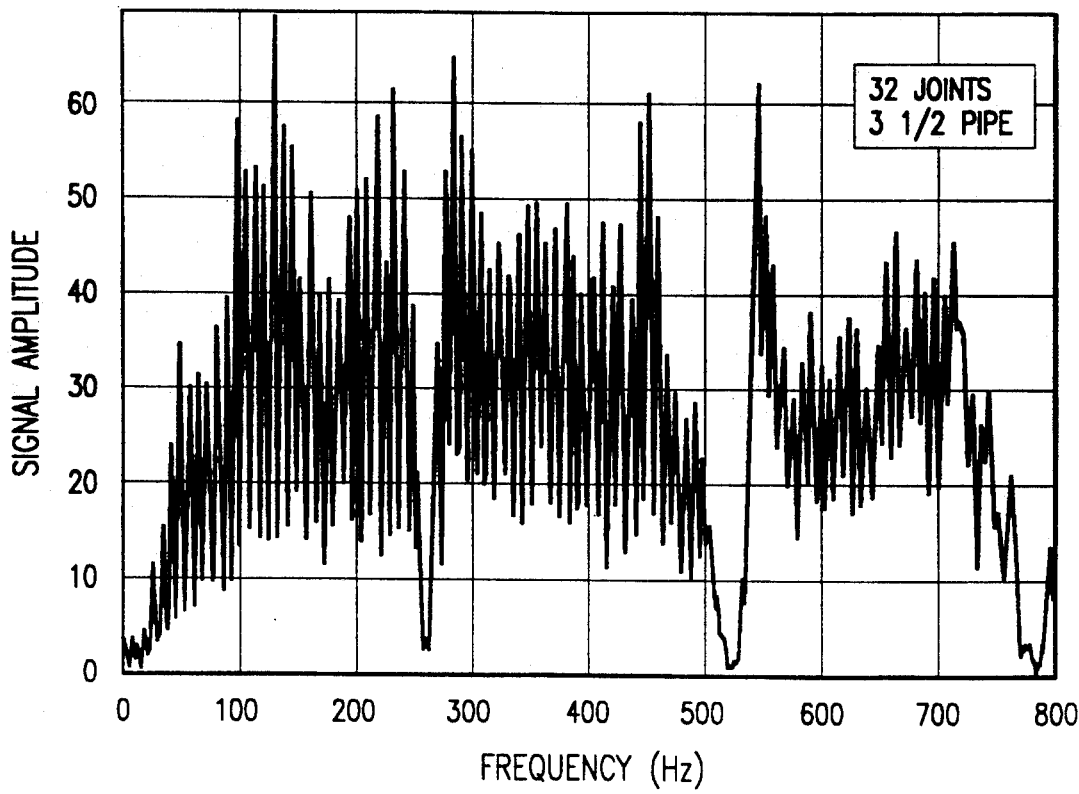
Figure 10:
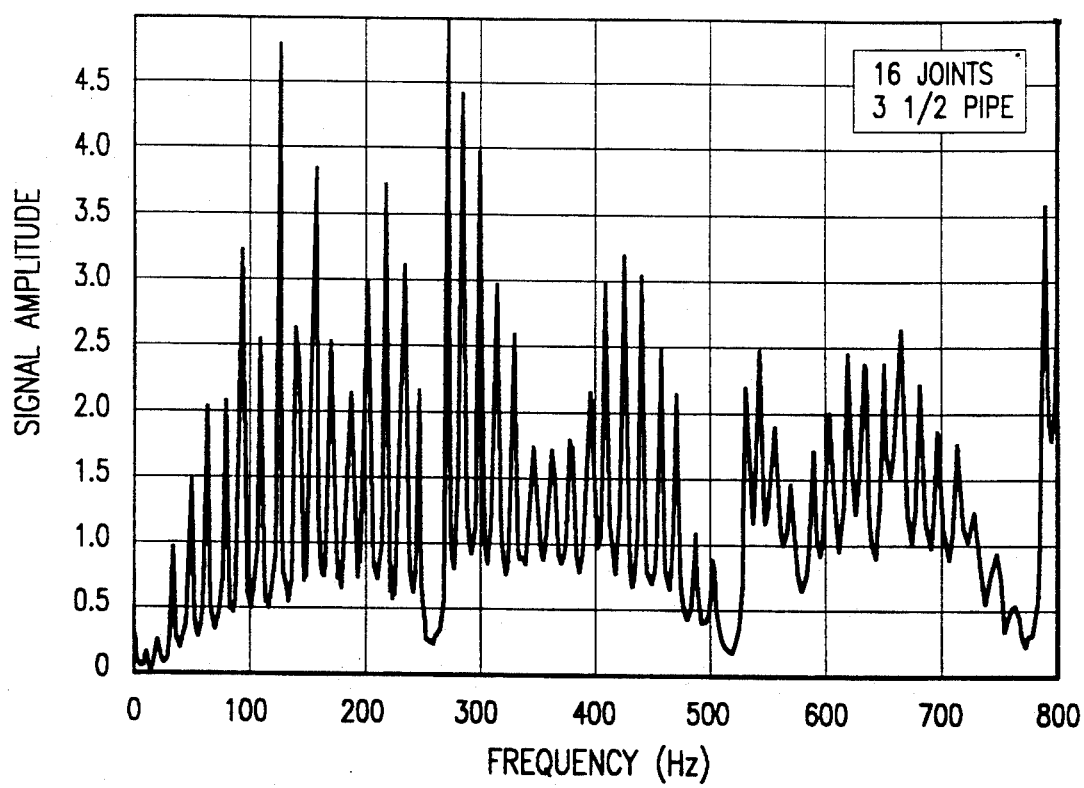

FIG. 9 is a similar plot as FIG. 8, limited at the high frequency end to 800 Hz, for a drill string of 32 joints of 3½ inch pipe, each approximately 31 feet in length as is conventional for drill pipe sections. Due to the change in scale, FIG. 9 shows more detail within each pass band, relative to FIG. 8. FIG. 10 is a similar plot as FIG. 9, for a drill string of 16 joints of 3½ inch pipe, each also approximately 31 feet in length. Although there are half as many joints of pipe in the case of FIG. 10 relative to FIG. 9, the dead bands and the pass bands are all almost exactly in the same areas on both plots. The correspondence of the dead bands at the same frequency is consistent with the theory described above, and indicates that an acceptable operating frequency for the signals imparted by transducer 40 is relatively independent of the number of joints of pipe used, so long as the joints are relatively the same length.

With further reference to FIG. 10, it should be noted that sixteen local peaks in the frequency characteristic are evident between each of the dead bands. These sixteen peaks correspond to the sixteen joints, or sections, of pipe in the drill string. It is contemplated that analysis of these local peaks and dead bands can be used to determine the structural integrity of each of the joints from time to time by periodically measuring the frequency response of the drill string on a test basis, using transducer 40 to vibrate drill string 10 over a wide range of frequencies. In the alternative, in the case where transducer 40 is implemented on a drill string or other structure which is continuous in a single section (i.e., with no local peaks or dead bands in its nominal frequency response), the subsequent detection of a local dead band can indicate the presence of a defect in the structure.

Torsional Wave Generator

Figure 14:
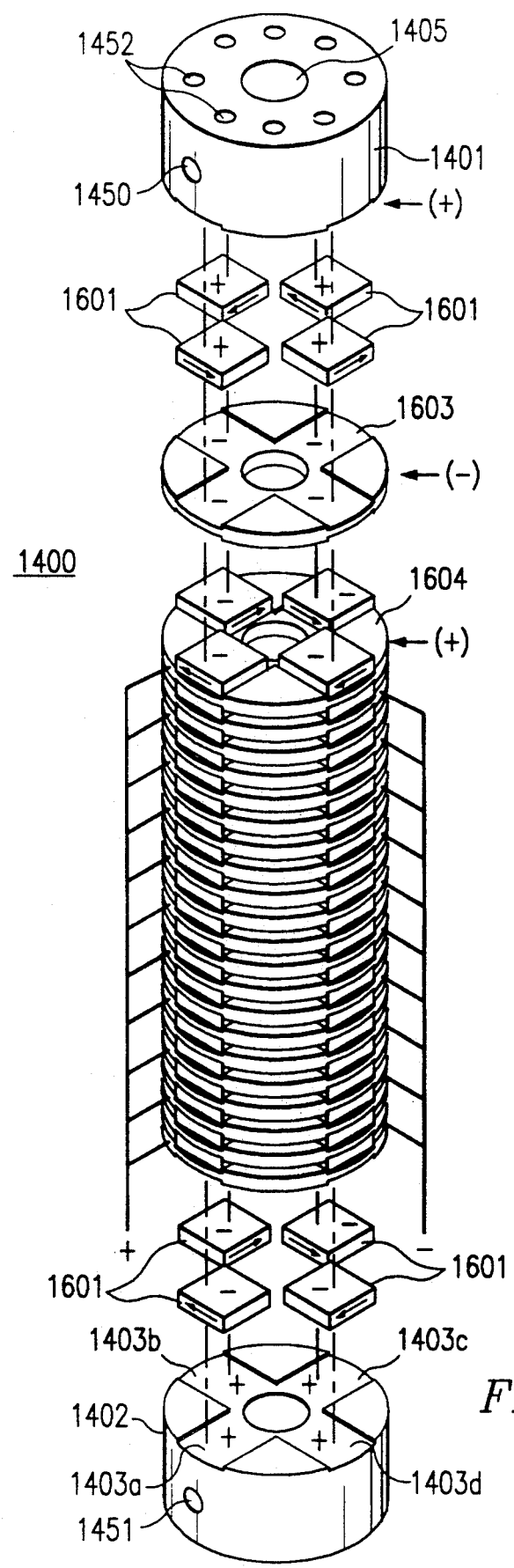

The embodiment described hereinabove has dealt with the construction and operation of a system where transducer 40 provided axial compression waves to the structure. Referring now to FIG. 14, an exploded view of a transducer 1400 for generating torsional waves, according to an alternative embodiment of the invention, is illustrated. Except for the details of its construction as specifically described hereinbelow, transducer 1400 can be used in substitution for transducer 40 described hereinabove.

Transducer 1400 includes brass end pieces 1401 and 1402 which, in this embodiment, each include four grooves 1403(a), (b), (c) and (d) milled therein. Grooves 1403 are each about a half inch wide and spaced 90° apart. Grooves 1403 are for retaining piezoelectric elements 1601 in a fixed position relative to one another, and for transferring the torsional force of piezoelectric elements 1601 to the end pieces 1401 and 1402.

Piezoelectric elements 1601 are preferably formed of PZT, as in the case described above relative to the compressional axial wave transducer 40, due to the ability of this material to operate at relatively high power while generating low frictional heat. This allows the distortions of piezoelectric elements 1601 to be effected at relatively high frequencies, for example as high as on the order of 2 kHz, which provides the potential of quite high data transmission rates.

The layers of piezoelectric elements 1601 adjacent to brass end pieces 1401 and 1402 are bonded thereto, preferably with a silver conductive epoxy. Brass washers 1603, each having grooves similar to grooves 1403 in end pieces 1401 and 1402 are placed between layers of piezoelectric elements 1601, throughout the length of the stack from end piece 1401 to end piece 1402. An example of a completed stack is approximately thirty layers of piezoelectric elements 1601, with washers therebetween.

Piezoelectric elements 1601 are polarized along a polarization axis, similarly as piezoelectric elements 53, 54 discussed hereinabove, but in this embodiment the voltage is applied orthogonal to the polarization axis of the elements (i.e., across the thickness of the elements). This results in a different physical force applied by piezoelectric elements 1601 in this embodiment.

Figure 16A:
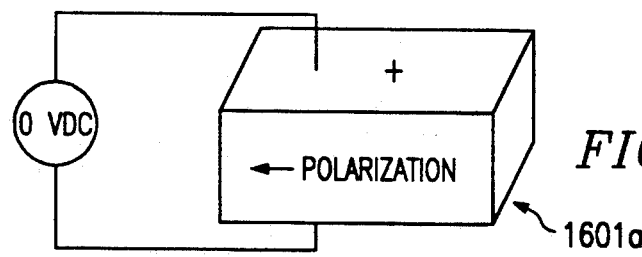
FIGS. 16a, 16b and 16c snow the distortion of the piezoelectric elements of the alternate transducer.
Figure 16B:
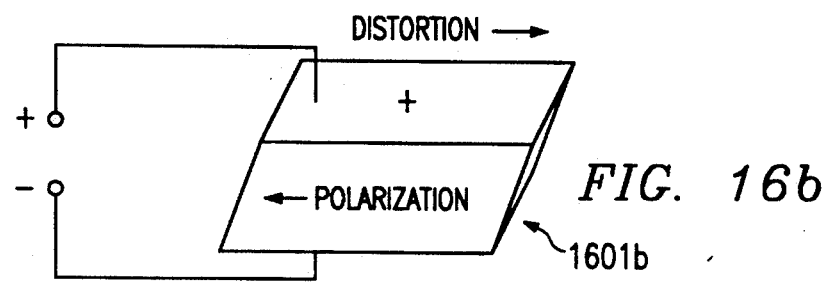
Figure 16C:
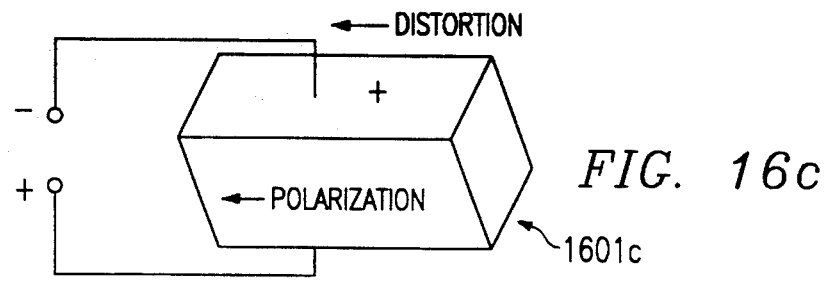

Referring to FIGS. 16a, 16b and 16c, the operation of an individual piezoelectric element or disk were a voltage is applied orthogonal to its polarization axis is schematically illustrated. FIG. 16a shows piezoelectric element 1601a at rest, with no external voltage applied. The polarization axis, illustrated by the arrow, points in a direction from the negative polarization pole to the positive pole. In the embodiment of FIG. 14, the quiescent state of generator 1400 has all elements in substantially this position. FIG. 16b shows a piezoelectric element 1601b with a positive voltage applied to the top surface orthogonally to the direction of polarization (the polarization axis), and illustrates the resultant distortion of the piezoelectric element. Note that the side of element 1601b which receives the positive voltage is distorted in an opposite direction from the direction of the polarization axis, with the side of element 1601b receiving the negative voltage distorted in the same direction as the polarization axis. Accordingly, element 1601b assumes a parallelogram-like shape inclined to the right. Similarly, FIG. 16c shows piezoelectric element 1601c with the voltage reversed relative to FIG. 16b, i.e. with the top surface having a negative voltage relative to the bottom. This shows element 1601c distorting in the opposite direction to form a parallelogram-like shape inclined to the left. Thus, comparing the two directions, piezoelectric elements 1601 generate physical force, left to right, responsive to the polarity of the voltage applied thereto, orthogonal to its polarization axis.

The alternating and wiring of the stack of FIG. 14 is similar to that described hereinabove for the stack of FIG. 5, but is modified to accommodate the different direction of physical force generated by piezoelectric elements 1601 in this embodiment. A first layer of piezoelectric elements 1601 is located adjacent end piece 1401 within transducer 1400, and oriented in such a manner that their polarization axes (negative-to-positive poles) are oriented in a counter-clockwise direction around the longitudinal axis of transducer 1400. A brass disk 1603 is located between this layer and the next adjacent layer of piezoelectric elements 1601; brass disk 1603 serves as an electrode in transducer 1400. In the adjacent layer of piezoelectric elements 1601, the polarization axes are oriented (negative-to-positive poles) in a clockwise direction around the longitudinal axis of transducer 1400. A brass disk 1604 is located adjacent this layer and the next adjacent layer of piezoelectric elements 1601. For each of piezoelectric elements 1601 shown in FIG. 14, the arrows indicate the direction of the polarization axis, pointing toward the positive pole, corresponding to its distortion direction for a given voltage polarity, as discussed above relative to FIGS. 16.

Similarly as in the embodiment described hereinabove for transducer 40, both the orientation of the piezoelectric elements 1601 alternate for alternating layers, and also the brass electrodes 1603 and 1604 are alternately connected to one another. In this way, for a given voltage polarity applied between electrodes 1603 and 1604, each layer of piezoelectric elements will distort in the same direction according to the convention of FIGS. 16. Therefore, since the orientation of elements 1601 in each layer alternate, and since the voltage also alternates, the net result is that all of elements 1601 in the stack move in the same direction for a given polarity of applied voltage between electrodes 1603 and 1604.

Due to the grooves in each of electrodes 1603 and 1604, and the grooves in end pieces 1401 and 102, together with the distortion of each of elements 1601 in the same direction for a given polarity, the distortion of each layer of elements 1601 is additive along the length of transducer 1400. As all elements 1601 distort in the same direction at the same time, each layer rotates its anchorment disk relative to the layer disposed therebelow. The distortion of each layer is thus additive to such distortion accomplished by the layers below, so the net result at the top is a rotational movement which is the sum of the movement of all the individual layers.

Note that an alternate construction of torsional transducer 1400 would include piezoelectric elements 1601 which are formed into a washer which has been cut into segments and properly polarized. Such a shape for the elements 1601 could present a more evenly distributed shape to the generated torsional force, and may as a result more efficiently convert the applied electrical signal into rotational force.

Figure 15:
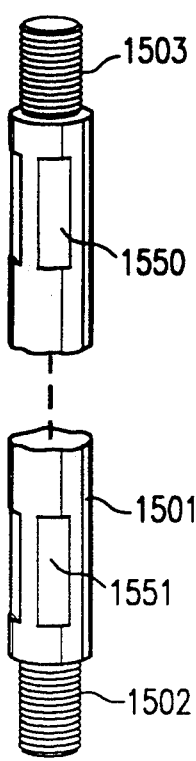
FIGS. 14 and 15 how details of an alternate embodiment of a transducer.

Brass end pieces 1401 (at the top) and 1402 (at the bottom) each have a hole 1405 counterbored therethrough to accept a nut for each end 1502, 1503 of shaft 1501 as shown in FIG. 15. Shaft 1501 is intended to be placed within transducer 1400 in the hole therethrough which is along its longitudinal axis. The end nuts, not shown, are used to preload the end pieces 1401 and 1402 with spring tension, so that when the elements distort and thus shrink slightly, pressure will be maintained. Ideally, shaft 1501 is constructed from spring steel, such as NP35N. Set screws, not shown, are used in tapped holes 1450 and 1451 of end pieces 1401 and 1402, respectively, to mate with flats 1550 and 1551, respectively (FIG. 15). This construction forces shaft 1501 to twist when voltage is applied to piezoelectric elements 1601, in either polarity. The twisting of shaft 1501 will store energy in kinetic form, so that transducer 1400 will tend to quickly return to its quiescent state when voltage is removed.

Shaft 1501 further includes threaded ends 1503 and 1502, at its bottom and top, respectively. Threaded mating ends 1503 connect shaft 1501 to top and bottom end pieces 1401 and 1402, respectively. Bolt holes 1452 on top piece 1401 correspond to mating end 41 of transducer 40 shown in FIGS. 4 and 6, so that transducer 1400 can be mounted within a sub 30 of drill string 10, or other appropriate structure, in similar fashion. Similar bolt holes (not shown) on the base 1402 at the free end of transducer 1400 can receive a mass 44 in similar fashion as transducer 40 described hereinabove. The mass 44 will, in the torsional case, have the same effect as before insofar as increasing the amplitude of the vibrational signal and allowing for the frequency tuning of the output characteristic of transducer 1400.

Of course, other techniques for mounting transducer 1400 within the desired structure can alternatively be used. In operation, transducer 1400 will impart torsional energy to the structure to which it is connected according to the electrical signals applied by electrodes 1603 and 1604. Transducer 1400 can be controlled to transmit information according to the system described hereinabove relative to FIG. 7, for example by frequency or phase shift keyed modulation. It should further be noted that torsional wave transducer 1400 can be used in any plane, including upside down (i.e., with the reactance mass attached at the top of transducer 1400).

It should further be noted that shaft 1501 may not be necessary in some applications, and also that the grooves in washers 1603 and 1604 may not be necessary in some applications.

The operation of a system constructed according to this embodiment of the invention, wherein transducer 1400 is adapted to provide torsional waves along drill string 10, will now be described. Each of FIGS. 17, 18 and 19 is a plot of the frequency response of drill string 10 to which torsional signals are imparted by a generator 1400 as described above, and illustrating relative to one another the measured vibration signal produced by inducing torsional stresses in pipe strings of varying lengths and sizes.

Figure 17:
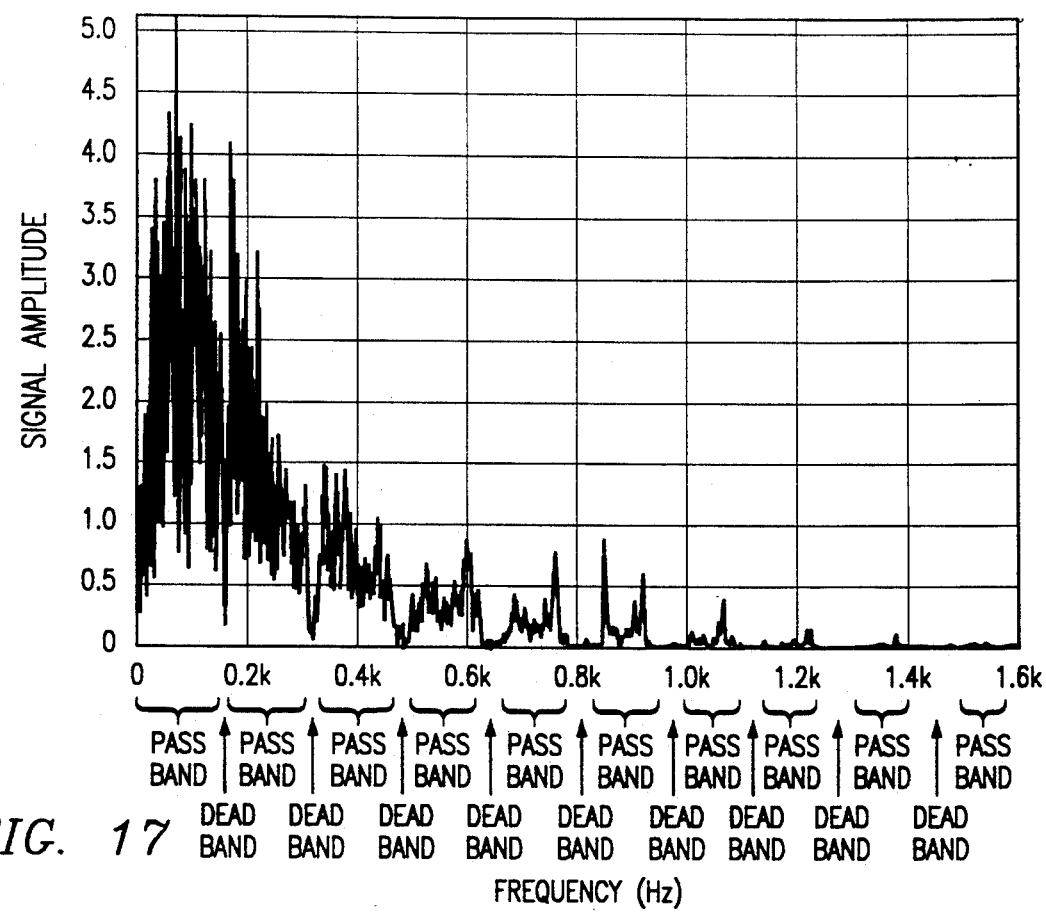
FIGS. 17, 18 and 19 show frequency charts illustrating the frequency response of the alternate transducer.
Figure 18:
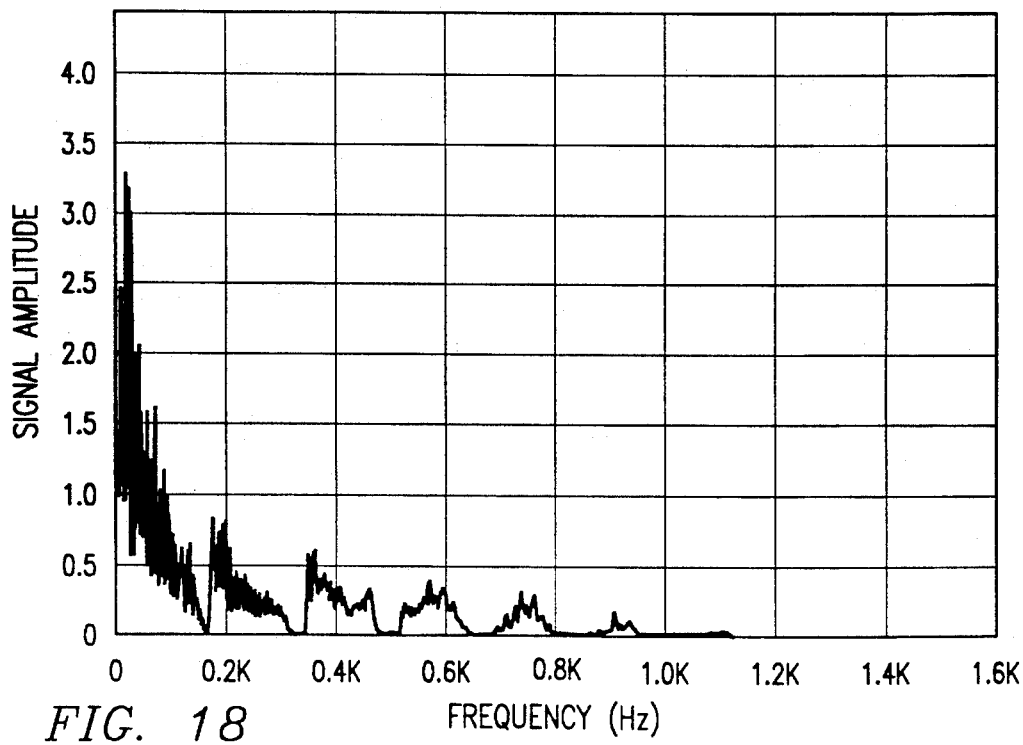

FIG. 17 shows pass bands and dead bands in the frequency response of a drill string, with the pass band being a frequency range where an applied signal may pass with a relatively high amplitude and the dead band being a frequency range within which the signal is attenuated as it travels along the pipe string, similarly as noted hereinabove. Similarly as in the case of compressional axial waves, the pass and dead bands are periodic in the frequency domain, and are due to reflections of the waves within individual sections of pipe, as in the case of compressional waves. However, the base dead band frequency is lower in the torsional case, due to the lower velocity in drill pipe of torsional waves (10,000 ft/sec) relative to compressional vibrations. As illustrated in each of FIGS. 17 through 19 for these examples of drill string 10, particularly, low frequency torsional signals, such as between zero and 180 Hz, pass relatively well. At frequencies in the neighborhood of 180 Hz, in a 10 or 20 Hz band thereabout, significant attenuation of the torsional wave signal occurs for this example.

FIG. 17 is a graph of the frequency response of 32 joints of 3½ inch drill pipe, with the joints averaging around 31 feet in length each, plus or minus one foot. FIG. 18 shows the frequency response of a pipe string having 32 joints of 2⅞ inch pipe, having similar lengths as those corresponding to FIG. 17. A comparison of FIGS. 17 and 18 illustrates that the frequency response of pipe strings of different sizes of pipe of approximately the same length is quite similar, each with pass bands and dead bands centered at about the same frequencies, although the amplitude varies somewhat within the individual pass bands. This comparison illustrates that a frequency selected for data transmission by torsional waves would not have to be changed if the size of the drill pipe is changed. In a drilling environment, since 31 feet is a relatively standard length of drill pipe, there thus is little need to vary the operating frequency of the torsional waves if the pipe size is changed.

Figure 19:
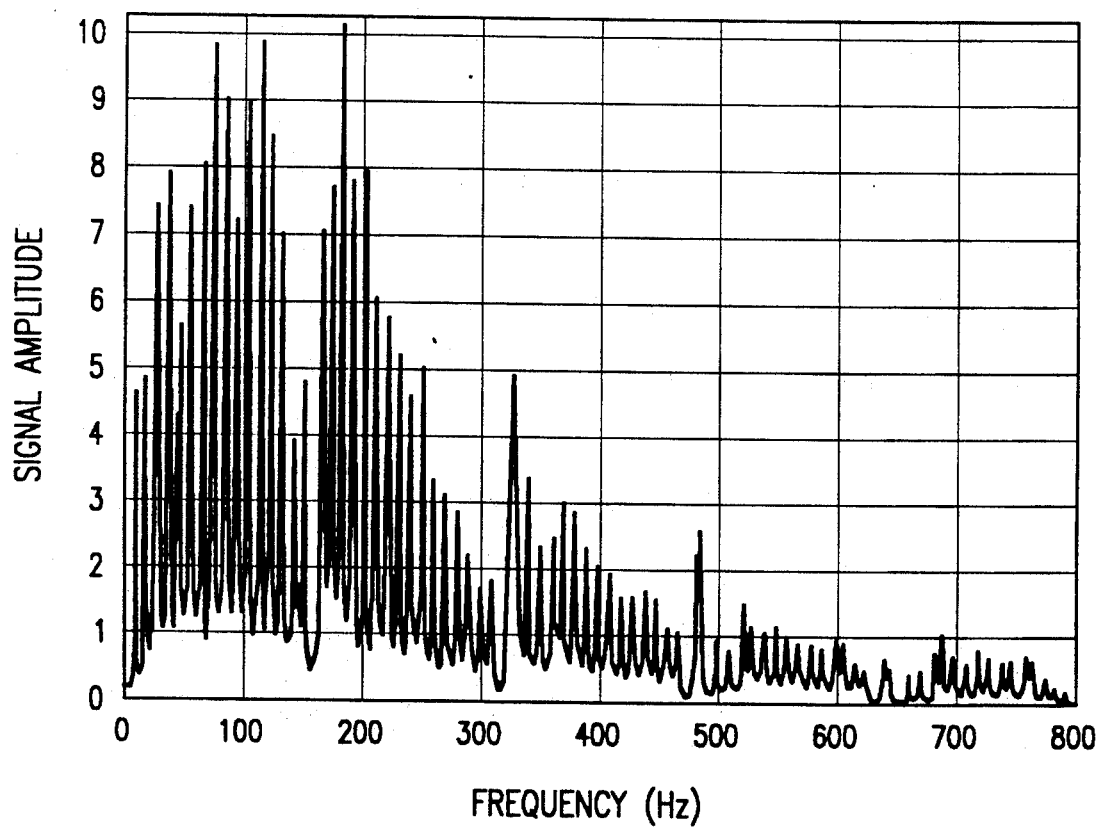

FIG. 19 illustrates the frequency response for a drill string of 16 joints (or sections) of 3½ inch pipe, for the application of torsional vibrations. By comparison with FIGS. 17 and 18, it can be seen that the dead bands and the pass bands for such a drill string still falls within the same general vicinity (note the difference in frequency scale between FIG. 19 and FIGS. 17 and 18). Specifically, the first dead band still falls in the neighborhood of 180 Hz, as in the earlier cases. This indicates that the system can operate at a set frequency regardless of the number of joints that are attached to the drill string. This is relatively important in the drilling operation, as the drill string is lengthened as the drilled hole deepens by way of adding sections of drill pipe to the pipe string. The similar frequency response to torsional waves illustrated above means that the operating frequency of a torsional wave generator need not be changed as the drill string length increases.

It should be noted that the embodiments described hereinabove, both in the compressional and the torsional case, use distortions of the piezoelectric elements in two opposing directions, to provide full sinusoidal vibrations of the two types. However, it should be noted that other signal shapes in the time domain, for example half-wave rectified vibrations (i.e., distortion in one direction only), triangle waves, or square waves, may alternatively be used by controlling transducer 40 or 1400 in the desired fashion.

It should be noted that for both the axial compressional transducer 40 and the torsional wave generator 1400 described hereinabove, the application described in detail is the vibration of the drill string 10. Alternatively, it is contemplated that the piezoelectric transducer can energize vibrations in drilling mud systems currently used in measurement-while-drilling (MWD) technology. Vibrations of drilling mud to transmit data therein are conventionally accomplished, in one application, by frequency modulation of the mud pulse carrier wave by variable rotation of a slotted rotor over a slotted stator, as described by Honeybourne, in "Measurement While Drilling", Symposium on the 75th Anniversary of the Oil Technology Course at the Royal School of Mines (1988). Transducer 40 and generator 1400 of piezoelectric elements can be used to present such modulations on drilling mud streams as well, when mounted in such a manner as described above with the drilling mud placed in contact therewith.

Accordingly, it is a technical advantage of my invention to provide a mechanism and method of imparting controlled vibrations of high amplitude and high frequency to a rigid structure such as a drill string. It is a further technical advantage to provide such vibrations using a material, such as a piezoelectric material, which expands and contracts upon the application of electrical signal pulses.

It is a still further technical advantage of my invention to physically attach a stack of piezoelectric disks to a well pipe and to provide modulation signals to the piezoelectric stack in such a manner so as to cause mechanical distortions to be induced in the pipe. It is a still further technical advantage to arrange the physical attachment of the stack to the pipe in such a manner so as to allow for the addition of mass to the vibratory stack while still maintaining the entire structure within the area of the well bore.

It is a still further technical advantage of my invention to provide a series of mechanical vibratory or distortion producing devices along the length of a drill pipe, each device capable of imparting to the pipe mechanical vibrations or distortions from coded electrical impulses.

It is a still further technical advantage to provide such a system in which each of the vibratory devices is individually tuned to the natural frequency of the drill string or structure in which the devices are located.

Although the present invention has been described with respect to a specific preferred embodiment thereof, various changes and modifications may be suggested by one skilled in the art, and it is intended that the present invention encompass such changes and modifications as fall within the scope of the appended claims.

I claim:

1. A method of transmitting data along a structure by torsional vibrational waves, comprising:
   mounting to said structure a transducer comprising a plurality of layers of piezoelectric material having electrodes disposed between adjacent ones of said layers, the piezoelectric material in each of said layers having its polarization axis oriented rotationally about a longitudinal axis of said structure, said plurality of layers arranged so that alternating layers have their polarization axes in opposing rotational directions;
   generating an electrical signal corresponding to the data to be transmitted; and
   energizing said electrodes according to said electrical signal so as to generate an electric field across each of said layers of piezoelectric material in a direction orthogonal to its polarization axis;
   wherein the generated electric field alternates in polarity in a manner corresponding to the alternating orientation of the polarization axis for alternating layers of piezoelectric material so that each of said plurality of layers of piezoelectric material exert a force in the same rotational direction relative to said longitudinal axis;
   and wherein the transducer is mounted to the structure in such a manner that the force exerted by said piezoelectric material is transmitted to said structure as torsional vibrations corresponding to said data.

2. The method of claim 1, wherein said step of generating an electrical signal comprises:
   receiving an analog electrical signal representative of said data; and
   converting said analog electrical signal into a modulated signal at a frequency;
   and wherein said energizing step energizes said electric field across said piezoelectric material according to said modulated signal.

3. The method of claim 2, wherein said converting step comprises:
   converting said analog electrical signal into a digital electrical signal; and
   generating a modulated signal at a frequency according to said digital electrical signal.

4. The method of claim 3, wherein said step of generating a modulated signal comprises frequency shift keying.

5. The method of claim 3, wherein said step of generating a modulated signal comprises phase shift keying.

6. The method of claim 1, further comprising:
   detecting torsional vibrations in said structure at a location remote from the location of said piezoelectric material.

7. The method of claim 1, wherein said step of generating an electrical signal comprises:
   generating a modulated signal at a plurality of frequencies;
   and wherein said energizing step energizes said electric field across said piezoelectric material according to said modulated signal.

8. The method of claim 7, further comprising:
   detecting torsional vibrations in said structure at a location remote from the location of said piezoelectric material, said torsional vibrations being at a plurality of frequencies.

9. The method of claim 1, wherein said structure is a drill string.

10. The method of claim 9, wherein said piezoelectric material is located within said drill string.

11. The method of claim 10, wherein said piezoelectric material is located below the surface of the earth.

12. The method of claim 11, further comprising: detecting torsional vibrations in said structure at a location remote from the location of said piezoelectric material.

13. The method of claim 12, wherein said detecting step is performed near the surface of the earth.

* * * * *